(12) United States Patent
Liu

(10) Patent No.: US 6,525,607 B1
(45) Date of Patent: Feb. 25, 2003

(54) HIGH-VOLTAGE DIFFERENTIAL INPUT RECEIVER

(75) Inventor: Jonathan H. Liu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/669,900

(22) Filed: Sep. 27, 2000

(51) Int. Cl.[7] .............................. H03F 3/45; H03F 1/52
(52) U.S. Cl. ...................................... 330/253; 330/298
(58) Field of Search .............................. 330/253, 258, 330/261, 298; 327/309

(56) References Cited

U.S. PATENT DOCUMENTS 5,281,924 A * 1/1994 Maloberti et al. ...... 330/258 X
5,909,135 A * 6/1999 Baldwin et al. ........ 327/309 X
6,061,275 A * 5/2000 Nagata ................... 365/203 X

* cited by examiner

*Primary Examiner*—Steven J. Mottola
(74) *Attorney, Agent, or Firm*—Antonelli, Terry, Stout & Kraus, LLP

(57) ABSTRACT

A high-voltage differential input receiver interfaces with an external channel. The differential input receiver includes a first stage, a second stage, and a third stage, which incrementally reduce in stages the common mode of a differential signal received from the external channel. During a power-down mode, clamping circuits in the differential input receiver clamp the voltage at nodes in the differential input receiver, and clamp the differential output from the first stage, to a predetermined voltage to prevent electrical overstress of oxide layers of n-channel and p-channel devices in the differential input receiver. Consequently, electrical overstress of oxide layers is prevented, and the voltage swing level of inputs from the external channel is reduced in stages from a higher voltage level to a lower voltage level.

36 Claims, 1 Drawing Sheet

HIGH-VOLTAGE DIFFERENTIAL INPUT RECEIVER

FIELD

This invention relates to integrated circuits, and more particularly to a high-voltage differential input receiver.

BACKGROUND

The voltage supplied to integrated circuits on a chip has decreased, for example, from 3.3 volts to 2.5 volts to 1.8 volts to 1.2 volts, as the integration processes have advanced. It is not uncommon that the voltage supplied to power the components on the chip is lower than the voltage levels used on the bus or in other circuits with which the chip communicates. For example, the Rambus Signal Level (RSL) of a Rambus Channel is typically between 1.0 volts and 1.8 volts, while the voltage supply on an exemplary chip that communicates with the Rambus Channel may be 1.2 volts.

As integrated circuit processes have advanced, the size of integrated circuits has decreased and the thickness of layers in the integrated circuits has been dramatically reduced. The oxide layers that form the gates of n-channel and p-channel transistors in the integrated circuits are consequently made thinner, and are susceptible to electrical overstress (EOS) when the voltage between the gate and the source, and also the voltage between the gate and the drain exceeds a maximum safe magnitude.

Increasingly, the circuitry on a chip must interface with voltage swing levels that are higher than the core voltage used to power the circuitry on the chip. The likelihood of electrical overstress of the gate oxide layers in the circuitry is therefore increasingly problematic. With regard to transistors on the chip, particularly those that interface with higher voltage levels off the chip, the voltage between the gate and the drain and the voltage between the gate and the source ought to be kept below a predetermined safe magnitude without sacrificing performance or consuming more power.

DETAILED DESCRIPTION

Figure 1:
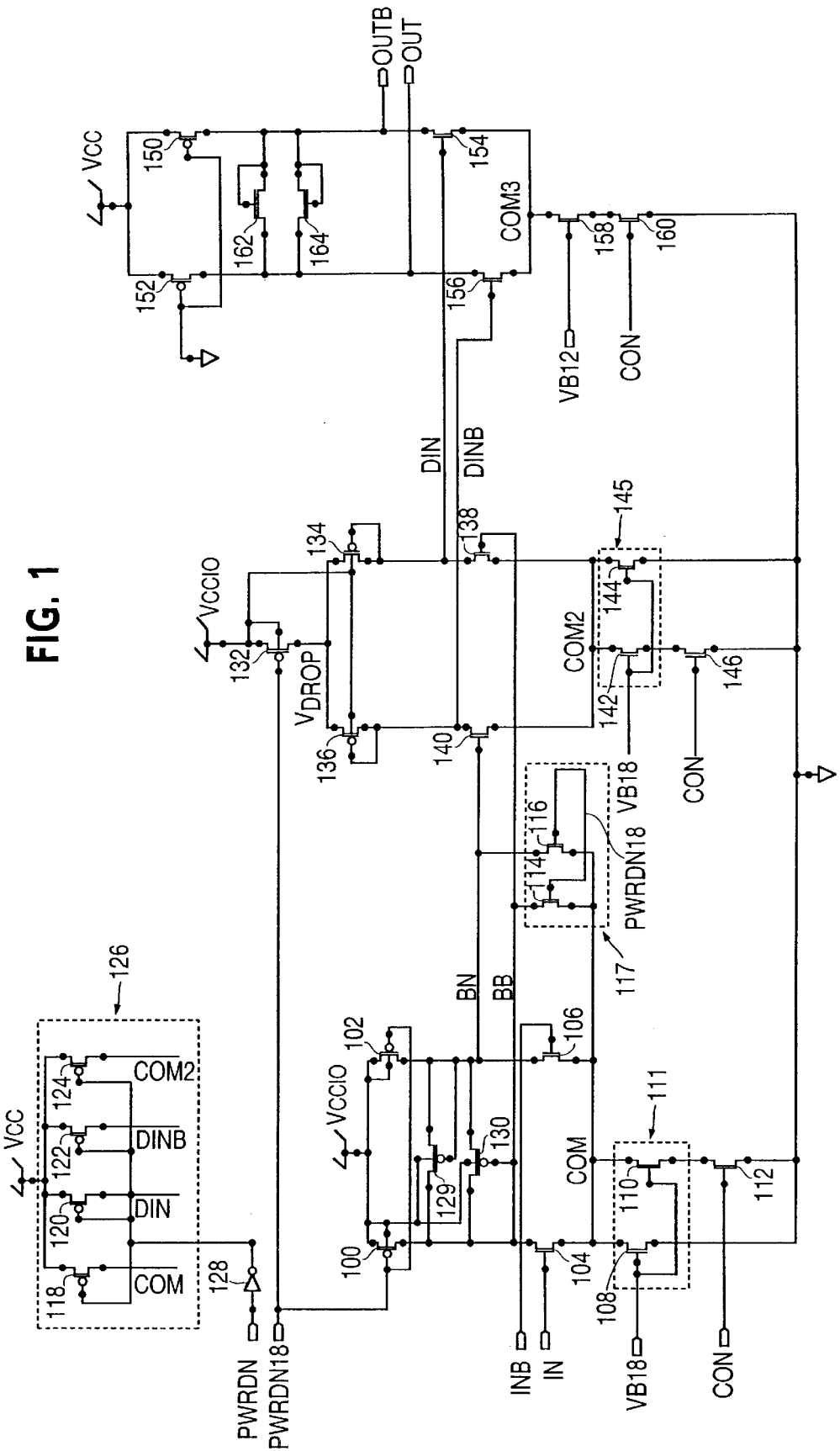
FIG. 1 a schematic view illustrating a high-voltage differential input receiver in accordance with the principles of the invention.

As integrated circuit processes have advanced, the size of integrated circuits and the chips on which they are formed has concomitantly decreased. The core voltages used on the chips to supply power to the circuits thereon have decreased; and, often, the voltage levels of the bus or external devices with which the chip interfaces are higher than the core voltage used to power the chip. The thickness of the oxide layers that function as the gates of transistors has decreased as integrated circuits have become more densely integrated. The gate oxide layers must be protected from damage resulting from electrical overstress (EOS) as the thickness of the gate oxide layer decreases. Specifically, with regard to the transistors on the chip that interface with bus levels off the chip, the voltage between the gate and the drain and the voltage between the gate and the source should be kept below a predetermined level.

An example of a high-voltage differential input receiver in accordance with the principles of the invention is illustrated in FIG. 1. The exemplary high-voltage differential input receiver is formed on a chip and uses a lower core voltage while interfacing with a higher-voltage external channel. The differential input receiver includes a first stage, a second stage, and a third stage, which incrementally reduce in stages the common mode of a differential input signal received from the external channel. The first stage outputs a first differential output signal having a first common mode. The second stage outputs a second differential output signal based on the first differential output signal and having a second common mode. The third stage outputs a third differential output signal based on the second differential output signal and having a third common mode. The third common mode is less than the second common mode. The second common mode is less than the first common mode. The first common mode is less than the common mode of the differential input signal.

Clamping circuits clamp the voltage at nodes in the differential input receiver to prevent electrical overstress of oxide layers of p-channel and n-channel devices in the differential input receiver. One such clamping circuit clamps the first differential output signal from the first stage to a predetermined voltage during a power-down mode to prevent electrical overstress (EOS) of the oxide layers in the gates of N-Channel Metal Oxide Semiconductor (NMOS) transistors and P-Channel Metal Oxide Semiconductor (PMOS) transistors in the first and second stages of the differential input receiver. Consequently, electrical overstress of gate oxide layers of transistors is prevented, and the voltage swing level of inputs from the bus, external devices or channels is reduced in stages from a higher voltage level to a lower voltage level, in accordance with the principles of the invention.

The differential input receiver illustrated in FIG. 1 includes the first stage, the second stage, and the third stage, as well as clamping circuits throughout the receiver. The differential input receiver receives a higher level voltage, for example, from a bus, external device or channel, and steps the voltage down in stages to a lower "core" (or "native") voltage. The clamping circuits prevent electrical overstress of n-channel and p-channel devices throughout the differential input receiver.

With reference to FIG. 1, the first stage includes a voltage supply $V_{CCIO}$. The voltage supply $V_{CCIO}$ can, for example, be at a voltage of 1.8 volts. A P-Channel Metal Oxide Semiconductor (PMOS) transistor 100 is coupled to the voltage supply $V_{CCIO}$. When the gate of a PMOS transistor is coupled to ground, the PMOS transistor is fully enabled to conduct current. In the schematic illustration of the circuit, the terminal of a PMOS transistor that is at the bottom is the drain. Unless specified, the fourth terminal from the substrate of a PMOS transistor is coupled to the core voltage. A PMOS transistor 102 is coupled to the voltage supply $V_{CCIO}$. An N-Channel Metal Oxide Semiconductor (NMOS) transistor 104 is coupled to the PMOS transistor 100. When the gate of an NMOS transistor is coupled to the core voltage, the NMOS transistor is fully enabled to conduct current. In the schematic illustration of the circuit, the terminal of an NMOS transistor that is at the top is the drain. Unless specified, the fourth terminal from the substrate of an NMOS transistor is coupled to ground. An NMOS transistor 106 is coupled to the PMOS transistor 102. An input pin labeled IN is coupled to the gate of the NMOS transistor 104. An input pin labeled INB is coupled to the gate of the NMOS transistor 106. The source of the PMOS transistor 100 is coupled to $V_{CCIO}$. The source of the PMOS transistor 102 is coupled to $V_{CCIO}$. The drain of the PMOS transistor 100 is coupled to the drain of the NMOS transistor 104. The drain of the PMOS transistor 102 is coupled to the drain of the NMOS transistor 106. The source of the NMOS transistor 104 is coupled to a node COM. The source of the NMOS transistor 106 is coupled to the node COM.

An input pin labeled PWRDN18 is coupled to the gate of the PMOS transistor 100 and to the gate of the PMOS transistor 102. A NMOS transistor 108 is coupled to the node COM. An NMOS transistor 110 is coupled to the node COM. The NMOS transistor 108 and the NMOS transistor 110 form a current source 111. An input pin labeled VB18 is coupled to the gate of the NMOS transistor 108 and to the gate of the NMOS transistor 110. The drain of the NMOS transistor 108 and the drain of the NMOS transistor 110 are each coupled to the COM node.

There are two paths in the first stage from the node COM to ground. The NMOS transistor 108 is in the first path. In the second path, an NMOS transistor 112 is coupled to the NMOS transistor 110. The drain of the NMOS transistor 112 is coupled to the source of the NMOS transistor 110. The source of the NMOS transistor 112 is coupled to ground. The source of the NMOS transistor 108 is coupled to ground. An input pin CON is coupled to the gate of the NMOS transistor 112.

A node BN is at the drain of NMOS transistor 106. A node BB is at the drain of NMOS transistor 104. The output of the first stage is at nodes BN and BB. An NMOS transistor 114 is coupled between the node BB and the node COM. A PMOS transistor 116 is coupled between the node BN and the node COM. The NMOS transistor 114 and the NMOS transistor 116 form a clamping circuit 117 which is used to prevent harmful electrical overstress (EOS) of the gate oxide layers of the NMOS transistor 104 and the NMOS transistor 106. The source of the NMOS transistor 114 and the source of the NMOS transistor 116 are coupled to the node COM. The drain of the NMOS transistor 114 and the drain of the NMOS transistor 116 are coupled to the node BB and the node BN, respectively. The gate of the NMOS transistor 114 and the gate of the NMOS transistor 116 are each coupled to the input pin PWRDN18.

A PMOS transistor 118, a PMOS transistor 120, a PMOS transistor 122, and a PMOS transistor 124 form a clamping circuit 126. The source of the PMOS transistor 118, the source of the PMOS transistor 120, the source of the PMOS transistor 122, and the source of the PMOS transistor 124 are coupled to a voltage supply $V_{CC}$. The voltage supply is the core (or native) voltage and can, for example, be at a voltage of 1.2 volts. The gate of PMOS transistor 118, the gate of PMOS transistor 120, the gate of PMOS transistor 122, and the gate of PMOS transistor 124 are coupled to the output of an inverter 128. The input of the inverter 128 is coupled to an input pin PWRDN. The drain of PMOS transistor 118 is coupled to the node COM. The drain of the PMOS transistor 120 is coupled to a node DIN. The drain of PMOS transistor 122 is coupled to a node DINB. The drain of the PMOS transistor 124 is coupled to a node COM2.

The second stage of the high-voltage differential input receiver receives the differential output from node BN and node BB of the first stage. The second stage includes the voltage supply $V_{CCIO}$. A PMOS transistor 132 is coupled to the voltage supply $V_{CCIO}$. A PMOS transistor 134 and a PMOS transistor 136 are coupled to the drain of the PMOS transistor 132. An NMOS transistor 138 and an NMOS transistor 140 are coupled to the PMOS transistor 134 and the PMOS transistor 136. The source of the NMOS transistor 140 and the source of the NMOS transistor 138 are coupled to the node COM2.

An NMOS transistor 142 and an NMOS transistor 144 are coupled to the node COM2. The NMOS transistor 142 and the NMOS transistor 144 form a current source 145 of the second stage.

The drain of the NMOS transistor 142 is coupled to the node COM2. The drain of the NMOS transistor 144 is coupled to the node COM2. The gate of the NMOS transistor 142 is coupled to the input pin VB18. The gate of the NMOS transistor 144 is coupled to the input pin VB18. With reference to FIG. 1, there are two paths between the node COM2 node and ground. In the first path, the NMOS transistor 144 is coupled between the node COM2 and ground. In the second path, an NMOS transistor 146 is coupled to the NMOS transistor 142. The gate of the NMOS transistor 146 is coupled to the input pin CON. The drain of the NMOS transistor 146 is coupled to the source of the NMOS transistor 142. The source of the NMOS transistor 146 is coupled to ground. The source of NMOS transistor 144 is coupled to ground.

The source of the PMOS transistor 132 is coupled to the voltage supply $V_{CCIO}$. The gate of the PMOS transistor 132 is coupled to the input pin PWRDN18. The fourth terminal from the substrate of the PMOS transistor 132 is coupled to the voltage supply $V_{CCIO}$. The drain of the PMOS transistor 132 is coupled to the source of the PMOS transistor 136 and the source of the PMOS transistor 134 at a node labeled $V_{DROP}$. The voltage at the node $V_{DROP}$ is equal to the voltage at the voltage supply $V_{CCIO}$ minus the voltage drop across the PMOS transistor 132. The fourth terminal from the substrate of the PMOS transistor 136 and the fourth terminal from the substrate of the PMOS transistor 134 are coupled to the voltage supply $V_{CCIO}$. The gate of the PMOS transistor 136 is coupled to the drain of the PMOS transistor 136 such that the PMOS transistor 136 functions as a diode. The gate of the PMOS transistor 134 is coupled to the drain of the PMOS transistor 134 such that the PMOS transistor 134 functions as a diode. Alternatively, the gate of the PMOS transistor 136 can be coupled to the input pin PWRDN18 such that the PMOS transistor 136 functions as a resistor; and the gate of the PMOS transistor 134 can be coupled to the input pin PWRDN18 such that the PMOS transistor 134 functions as a resistor.

The drain of the NMOS transistor 140 is coupled to the drain of the PMOS transistor 136. The drain of the NMOS transistor 138 is coupled to the drain of the PMOS transistor 134. The gate of the NMOS transistor 140 is coupled to the node BN. The gate of NMOS transistor 138 is coupled to the node BB. The NMOS transistor 140 and the NMOS transistor 138 serve as the input devices to the second stage of the high-voltage differential input receiver. The source of the NMOS transistor 140 is coupled to the node COM2. The source of the NMOS transistor 138 is coupled to the node COM2. A node DIN at the drain of the NMOS transistor 138 and a node DINB at the drain of the NMOS transistor 140 are the differential output of the second stage of the high-voltage differential input receiver.

The differential output from the node DIN and the node DINB is received by the third stage of the high-voltage differential input receiver. The third stage includes the voltage supply $V_{CC}$. A PMOS transistor 150 is coupled to the voltage supply $V_{CC}$. A PMOS transistor 152 is coupled to the voltage supply $V_{CC}$. An NMOS transistor 154 and an NMOS transistor 156 are the input devices of the third stage, and receive the differential output from the node DIN and the node DINB of the second stage. The drain of the NMOS transistor 154 is coupled to the drain of the PMOS transistor 150. The drain of the NMOS transistor 156 is coupled to the drain of the PMOS transistor 152. The gate of the PMOS transistor 150 and the gate of the PMOS transistor 152 are coupled to ground. The source of the PMOS transistor 150 is coupled to the voltage supply $V_{CC}$. The source of the PMOS transistor 152 is coupled to the voltage supply $V_{CC}$. The PMOS transistor 150 and the PMOS transistor 152 function as resistors.

The gate of the NMOS transistor 154 is coupled to the node DIN. The gate of the NMOS transistor 156 is coupled to the node DINB. The source of the NMOS transistor 154 is coupled to the node COM3. The source of the NMOS transistor 156 is coupled to the node COM3.

In the path from the node COM3 to ground, an NMOS transistor 158 is a current source for the third stage, and an NMOS transistor 160 is coupled between the NMOS transistor 158 and ground. The drain of the NMOS transistor 158 is coupled to the node COM3. The gate of the NMOS transistor 158 is coupled to an input pin labeled VB12. The drain of the NMOS transistor 160 is coupled to the source of the NMOS transistor 158. The source of the NMOS transistor 160 is coupled to ground. The gate of the NMOS transistor 160 is coupled to the node CON.

The high-voltage differential input receiver presents a differential output at an output pin OUT and an output pin OUTB. The output pin OUT is coupled to the drain of the NMOS transistor 156. The output pin OUTB is coupled to the drain of the NMOS transistor 154.

Optionally, the third stage can include an NMOS transistor 162 and an NMOS transistor 164, which function as a clamping circuit. The source and drain of the NMOS transistor 162 are coupled to the output pin OUT and the output pin OUTB. The source and drain of the NMOS transistor 164 are coupled to the output pin OUT and the output pin OUTB.

The high-voltage differential input receiver operates in three modes: normal mode, power-down mode, and power-saving mode. During normal mode, the input pin PWRDN18 is biased (e.g., at 0.7 volts) such that the PMOS transistor 100 and the PMOS transistor 102 act as resistors. The current through the node COM is constant. The input pin VB18 is biased (e.g., at 0.3 volts) such that the NMOS transistor 108 and the NMOS transistor 110 in the current source 111 function as a current source for the first stage. The pin CON is biased (e.g., at 1.2 volts) such that the NMOS transistor 112 is enabled to conduct current.

The differential input to the first stage from input pin IN and input pin INB is received by NMOS transistor 104 and NMOS transistor 106. The voltage swing level on the input pin IN and the input pin INB is, for example, in a range between 1.0 volts and 1.8 volts. The current through the NMOS transistor 104 through the node COM to ground is complementary to the current through the NMOS transistor 106 through the node COM to ground. As the voltage at the node BB goes up, the voltage at the node BN goes down, and as the voltage at the node BB goes down, the voltage at the node BN goes up. The optional PMOS transistor 129 and PMOS transistor 130 function to limit the maximum difference between the voltage at node BN and the voltage at node BB.

During normal mode, the voltage at pin PWRDN18 is biased such that no current flows through the NMOS transistor 114 and the NMOS transistor 116 in the clamping circuit 117. The voltage at the input pin PWRDN is at ground during normal mode. The output of the inverter 128 is at the same voltage as the voltage supply $V_{CC}$. As a result, the voltage at the gate of the PMOS transistor 118, the gate of the PMOS transistor 120, the gate of the PMOS transistor 122, and the gate of the PMOS transistor 124 is at the voltage of voltage supply $V_{CC}$. Thus, during normal mode, no current passes through the PMOS transistor 118, the PMOS transistor 120, the PMOS transistor 122, and the PMOS transistor 124.

During power-down mode, the voltage at the input pin PWRDN18 rises to the voltage of voltage supply $V_{CCIO}$. The voltage at the input pin PWRDN rises to the voltage of voltage supply $V_{CC}$ during power-down mode. The voltage at input pin VB18 drops to ground. The voltage at the input pin CON drops to ground.

Because the voltage at the input pin PWRDN18 rises to $V_{CCIO}$, the NMOS transistor 114 and the NMOS transistor 116 in the clamping circuit 117 become enabled to conduct current. When the NMOS transistor 114 and the NMOS transistor 116 are enabled to conduct current, the voltage at the node BN and the voltage at the node BB are thereby clamped to the voltage at the node COM in accordance with the principles of the invention.

Because the voltage at the input pin PWRDN rises to $V_{CC}$, the output of the inverter 128 drops to ground during power-down mode. Accordingly, the gates of the PMOS transistor 118, the PMOS transistor 120, the PMOS transistor 122, and the PMOS transistor 124 are at ground during power-down mode. Because the gates of the PMOS transistor 118, the PMOS transistor 120, the PMOS transistor 122, and the PMOS transistor 124 are at ground during power-down mode, current flows through those PMOS transistors. When those PMOS transistors are enabled, and current flows through those PMOS transistors: The voltage at the drain of the PMOS transistor 118 is drawn to the voltage of the voltage supply $V_{CC}$ such that the node COM is clamped to the voltage of voltage supply $V_{CC}$; the voltage at the drain of the PMOS transistor 120 is drawn to the voltage at voltage supply $V_{CC}$ such that the node DIN is clamped to the voltage of voltage supply $V_{CC}$; the voltage at the drain of the PMOS transistor 122 is drawn to the voltage of the voltage supply $V_{CC}$ such that the voltage at the node DINB is clamped to the voltage of the voltage supply $V_{CC}$; and the drain of the PMOS transistor 124 is drawn to the voltage of the voltage supply $V_{CC}$ such that the voltage at the node COM2 is clamped to $V_{CC}$.

Because the voltage of the node COM is clamped to $V_{CC}$, the voltage at the node BN and the node BB are clamped to the voltage of voltage supply $V_{CC}$ during power-down mode according to the principles of the invention. As a result, for both NMOS transistor 104 and NMOS transistor 106, the difference between the voltage at the drain and the voltage at the gate, and the difference between the voltage at the source and the voltage at the gate is kept below a harmful magnitude, as taught herein.

During power-save mode, the voltage at the input pin CON drops to ground. This reduces the amount of current provided by current source 111 and reduces the power consumed by the first stage of the differential input receiver.

During normal mode, the second stage receives the differential signal from node BN and node BB at the gate of NMOS transistor 140 and the gate of NMOS transistor 138, and the current through the node COM2 to ground is constant. The voltage at the input pin VB18 is biased such that the NMOS transistor 142 and the NMOS transistor 144 in the current source 145 function as the current source for stage two. The voltage at the node CON is biased such that the NMOS transistor 146 is enabled to conduct current.

As the current through the NMOS transistor 140 through the node COM2 to ground decreases, the current through the NMOS transistor 138 through the node COM2 to ground increases; and, as the current through the NMOS transistor 140 through the node COM2 to ground increases, the current through the NMOS transistor 138 through the node COM2 to ground decreases. As the voltage at the node DINB increases, the voltage at the node DIN decreases. As the voltage at the node DINB decreases, the voltage at the node DIN increases.

During normal mode, the PMOS transistor 136 and the PMOS transistor 134 function as diodes. Alternatively, if the gate of the PMOS transistor 136 and the gate of the PMOS transistor 134 are coupled to the input pin PWRDN18, then the PMOS transistor 136 and the PMOS transistor 134 function as resistors. During normal mode, the voltage at the input pin PWRDN18 is biased such that the PMOS transistor 132 functions as a resistor and there is a voltage drop across the PMOS transistor 132 from the voltage supply $V_{CCIO}$ to a lower voltage at the node $V_{DROP}$. According to the principles of the invention, this advantageously limits the output swing that node DIN or node DINB can obtain. For example, if $V_{CCIO}$ is 1.8 volts, the voltage drop across the PMOS transistor 132 functioning as a resistor is approximately equal to 0.3 volts such that the voltage at the node $V_{DROP}$ is equal to approximately 1.5 volts during normal mode. The node $V_{DROP}$ serves as a virtual voltage supply for the second stage, and the swing level of the node DIN and the node DINB can go no higher than approximately 1.5 volts during normal mode in accordance with the principles of the invention.

During power-down mode, the voltage at the node BN and the voltage at the node BB are clamped to the voltage at the node COM, which is clamped to the voltage at voltage supply $V_{CC}$. The voltage at the node COM2 is clamped to the voltage at voltage supply $V_{CC}$ by way of clamping circuit 126. The voltage at the node DIN is clamped to the voltage at voltage supply $V_{CC}$ by way of clamping circuit 126. The voltage at the node DINB is clamped to the voltage at voltage supply $V_{CC}$ by way of clamping circuit 126. Therefore, for both NMOS transistor 140 and NMOS transistor 138, the difference between the voltage at the gate and the voltage at the source and the difference between the voltage at the gate and the voltage at the drain is kept below a harmful magnitude.

During power-save mode, the voltage at the input pin CON drops to ground, which disables the NMOS transistor 146 from conducting current. This reduces the amount of current available at the node COM2 and reduces the power consumed by stage two during power-save mode.

In stage three, during normal mode, the differential output from stage two presented at the node DIN and the node DINB is supplied to the NMOS transistor 156 and the NMOS transistor 154. The current from the node COM3 to ground is constant such that as the voltage at the output pin OUT drops, the voltage at the output pin OUTB rises; and, as the voltage at the output pin OUT rises, the voltage at the output pin OUTB drops. During normal mode, the voltage at the input pin VB12 is biased (e.g., at 0.3 volts) such that the NMOS transistor 158 supplies current to the second stage. The voltage at the node CON is biased such that the NMOS transistor 160 is enabled to conduct current during normal mode. The NMOS transistor 152 and the NMOS transistor 150 function as resistors. The optional NMOS transistor 162 and NMOS transistor 164 clamp the output pin OUT and the output pin OUTB by limiting the maximum difference between the voltage at the output pin OUT and the voltage at the output pin OUTB.

During power-down mode, the voltage at the input pin VB12 drops to ground. Because the voltage at the input pin VB12 drops to ground, the NMOS transistor 158 is disabled and cannot conduct current. The voltage at the input pin CON drops to ground during power-down mode. As a result, the NMOS transistor 160 cannot conduct current during power-down mode. The voltage at the node DIN and the voltage at the node DINB are clamped to the voltage of voltage supply $V_{CC}$ by operation of the clamping circuit 126 in response to the voltage at input pin PWRDN during power-down mode. Consequently, for both NMOS transistor 154 and NMOS transistor 156, the voltage difference between the gate and the source and the voltage difference between the gate and the drain are kept below a harmful level, which protects the gate oxide layers of the devices from electrical overstress (EOS) during power-down mode.

During power-saving mode, the voltage at the input pin CON drops to ground and turns off current at the node COM3.

During normal mode, the common mode (or cross-point) of node BN and node BB is higher than the core voltage of voltage supply $V_{CC}$. Given this relatively high common mode, which is higher than the core voltage at voltage supply $V_{CC}$, if node BN and node BB were coupled directly into stage three, the differential output receiver would not work well. The second stage is needed as an intermediary to lower the common mode of node BN and node BB before the differential output is passed to stage three. The second stage translates the differential output at node BN and node BB into the differential output at node DIN and node DINB, which is acceptable for the third stage.

In the clamping circuit 126, the PMOS transistor 120, the PMOS transistor 122, and the PMOS transistor 124 may be optional. The PMOS transistor 118 may be adequate for clamping voltages at nodes in the circuit to levels that prevent electrical overstress.

While various embodiments of the present invention have been described above, it should be understood that they have been presented by way of example, and not limitation. It will be apparent to persons skilled in the relevant arts that various changes in form and detail can be made without departing from the spirit and scope of the invention.

What is claimed is:

1. A receiver, comprising:
   a first differential amplifier stage that receives a differential input signal from an external channel and produces a first differential output signal based on the differential input signal;
   a second differential amplifier stage that receives the first differential output signal and produces a second differential output signal based on the first differential output signal; and
   a clamping circuit to clamp the first differential output signal of the first differential amplifier stage to a predetermined voltage level during at least one predetermined mode to prevent electrical overstress (EOS) in gate oxide layers of at least the first differential amplifier stage during the at least one predetermined mode.

2. A receiver as claimed in claim 1, wherein the clamping circuit clamps the first differential output signal of the first differential amplifier stage to the predetermined voltage level by shorting first differential output signal lines to a predetermined circuit node of the first differential amplifier stage, having the predetermined voltage level impressed thereon.

3. A receiver as claimed in claim 1, wherein the receiver is a higher-voltage-to-lower-voltage interfacing receiver to receive the differential input signal from the external channel and to convert the same to an output differential signal of a lower voltage compatible with a native signal level of a circuit to receive the output differential signal, the first and second differential amplifier stages bias-able with a biasing voltage level which is higher than a native voltage level of a circuit to receive the output differential signal, the receiver further comprising:

a third differential amplifier stage that receives the second differential output signal and produces the output differential signal based on the second differential output signal, the third differential amplifier stage bias-able with the native voltage level.

4. A receiver as claimed in claim 3, wherein the clamping circuit clamps the first differential output signal of the first differential amplifier stage to the predetermined voltage level by shorting first differential output signal lines to a predetermined circuit node of the first differential amplifier stage, having the predetermined voltage level impressed thereon, the predetermined voltage level being a voltage level between the biasing voltage level and ground.

5. A receiver as claimed in claim 3, further comprising:

a second clamping circuit to clamp the second differential output signal of the second differential amplifier stage to a second predetermined voltage level during the at least one predetermined mode, to prevent electrical overstress (EOS) in gate oxide layers of at least the third differential amplifier stage during the at least one predetermined mode.

6. A receiver as claimed in claim 1, the clamping circuit to clamp the first differential output signal of the first differential amplifier stage to the predetermined voltage level during at least a power reduction mode to prevent electrical overstress (EOS) in gate oxide layers of at least the first differential amplifier stage during the power reduction mode.

7. A receiver as claimed in claim 1, further comprising:

a shorting circuit to short differential output signal lines of the first differential amplifier stage together during the at least one predetermined mode, to maintain the differential output signal lines at substantially a common voltage.

8. A receiver as claimed in claim 1, further comprising:

a limiting circuit to limit a voltage difference between differential output signal lines of the first differential amplifier stage, to a predetermined maximum voltage difference.

9. A receiver as claimed in claim 1, the second differential amplifier stage comprising a voltage drop circuit to reduce a voltage swing level of the second differential output signal to a lower voltage swing level than the first differential output signal of the first differential amplifier stage.

10. An integrated circuit (IC) comprising:

a receiver including:

a first differential amplifier stage that receives a differential input signal from an external channel and produces a first differential output signal based on the differential input signal;

a second differential amplifier stage that receives the first differential output signal and produces a second differential output signal based on the first differential output signal; and a clamping circuit to clamp the first differential output signal of the first differential amplifier stage to a predetermined voltage level during at least one predetermined mode to prevent electrical overstress (EOS) in gate oxide layers of at least the first differential amplifier stage.

11. An IC as claimed in claim 10, wherein the clamping circuit clamps the first differential output signal of the first differential amplifier stage to the predetermined voltage level by shorting first differential output signal lines to a predetermined circuit node of the first differential amplifier stage, having the predetermined voltage level impressed thereon.

12. An IC as claimed in claim 10, wherein the receiver is a higher-voltage-to-lower-voltage interfacing receiver to receive the differential input signal from the external channel and to convert the same to an output differential signal of a lower voltage compatible with a native signal level of the IC, the first and second differential amplifier stages bias-able with a biasing voltage level which is higher than a core voltage level of the IC, the receiver further comprising:

a third differential amplifier stage that receives the second differential output signal and produces the output differential signal based on the second differential output signal, the third differential amplifier stage bias-able with the core voltage level.

13. An IC as claimed in claim 12, wherein the clamping circuit clamps the first differential output signal of the first differential amplifier stage to the predetermined voltage level by shorting first differential output signal lines to a predetermined circuit node of the first differential amplifier stage, having the predetermined voltage level impressed thereon, the predetermined voltage level being a voltage level between the biasing voltage level and ground.

14. An IC as claimed in claim 12, further comprising:

a second clamping circuit to clamp the second differential output signal of the second differential amplifier stage to a second predetermined voltage level during the at least one predetermined mode, to prevent electrical overstress (EOS) in gate oxide layers of at least the third differential amplifier stage during the at least one predetermined mode.

15. An IC as claimed in claim 10, the clamping circuit to clamp the first differential output signal of the first differential amplifier stage to the predetermined voltage level during at least a power reduction mode to prevent electrical overstress (EOS) in gate oxide layers of at least the first differential amplifier stage during the power reduction mode.

16. An IC as claimed in claim 10, further comprising:

a shorting circuit to short differential output signal lines of the first differential amplifier stage together during the at least one predetermined mode, to maintain the differential output signal lines at substantially a common voltage.

17. An IC as claimed in claim 10, further comprising:

a limiting circuit to limit a voltage difference between differential output signal lines of the first differential amplifier stage, to a predetermined maximum voltage difference.

18. An IC as claimed in claim 10, the second differential amplifier stage comprising a voltage drop circuit to reduce a voltage swing level of the second differential output signal to a lower voltage swing level than the first differential output signal of the first differential amplifier stage.

19. An integrated circuit (IC) comprising:
a receiver including:
first differential amplifier means for receiving a differential input signal from an external channel and producing a first differential output signal based on the differential input signal;
second differential amplifier means for receiving the first differential output signal and producing a second differential output signal based on the first differential output signal; and
clamping means for clamping the first differential output signal of the first differential amplifier means to a predetermined voltage level during at least one predetermined mode to prevent electrical overstress (EOS) in gate oxide layers of at least the first differential amplifier means.

20. An IC as claimed in claim 19, wherein the clamping means for clamping the first differential output signal of the first differential amplifier means to the predetermined voltage level by shorting first differential output signal lines to a predetermined circuit node of the first differential amplifier means, having the predetermined voltage level impressed thereon.

21. An IC as claimed in claim 19, wherein the receiver is a higher-voltage-to-lower-voltage interfacing receiver to receive the differential input signal from the external channel and to convert the same to an output differential signal of a lower voltage compatible with a native signal level of the IC, the first and second differential amplifier means bias-able with a biasing voltage level which is higher than a core voltage level of the IC, the receiver further comprising:
third differential amplifier means for receiving the second differential output signal and producing the output differential signal based on the second differential output signal, the third differential amplifier means bias-able with the core voltage level.

22. An IC as claimed in claim 21, wherein the clamping means for clamping the first differential output signal of the first differential amplifier means to the predetermined voltage level by shorting first differential output signal lines to a predetermined circuit node of the first differential amplifier means, having the predetermined voltage level impressed thereon, the predetermined voltage level being a voltage level between the biasing voltage level and ground.

23. An IC as claimed in claim 21, further comprising:
second clamping means for clamping the second differential output signal of the second differential amplifier means to a second predetermined voltage level during the at least one predetermined mode, to prevent electrical overstress (EOS) in gate oxide layers of at least the third differential amplifier means during the at least one predetermined mode.

24. An IC as claimed in claim 19, the clamping means for clamping the first differential output signal of the first differential amplifier means to the predetermined voltage level during at least a power reduction mode to prevent electrical overstress (EOS) in gate oxide layers of at least the first differential amplifier means during the power reduction mode.

25. An IC as claimed in claim 19, further comprising:
shorting means for shorting differential output signal lines of the first differential amplifier means together during the at least one predetermined mode, to maintain the differential output signal lines at substantially a common voltage.

26. An IC as claimed in claim 19, further comprising:
limiting means for limiting a voltage difference between differential output signal lines of the first differential amplifier means, to a predetermined maximum voltage difference.

27. An IC as claimed in claim 19, the second differential amplifier means comprising voltage drop means for reducing a voltage swing level of the second differential output signal to a lower voltage swing level than the first differential output signal of the first differential amplifier means.

28. A method of preventing electrical overstress (EOS) in a receiver of an integrated circuit (IC), comprising:
receiving a differential input signal from an external channel at a first differential amplifier stage and producing a first differential output signal based on the differential input signal;
receiving the first differential output signal at a second differential amplifier stage and producing a second differential output signal based on the first differential output signal; and
clamping the first differential output signal of the first differential amplifier stage to a predetermined voltage level during at least one predetermined mode to prevent electrical overstress (EOS) in gate oxide layers of at least the first differential amplifier stage.

29. A method as claimed in claim 28, wherein the clamping clamps the first differential output signal of the first differential amplifier stage to the predetermined voltage level by shorting first differential output signal lines to a predetermined circuit node of the first differential amplifier stage, having the predetermined voltage level impressed thereon.

30. A method as claimed in claim 28, wherein the receiver is a higher-voltage-to-lower-voltage interfacing receiver to receive the differential input signal from the external channel and to convert the same to an output differential signal of a lower voltage compatible with a native signal level of the IC, the method further comprising:
biasing the first and second differential amplifier stages with a biasing voltage level which is higher than a core voltage level of the IC;
biasing a third differential amplifier stage with the core voltage level of the IC;
receiving the second differential output signal at the third differential amplifier stage and producing the output differential signal based on the second differential output signal.

31. A method as claimed in claim 30, wherein the clamping clamps the first differential output signal of the first differential amplifier stage to the predetermined voltage level by shorting first differential output signal lines to a predetermined circuit node of the first differential amplifier stage, having the predetermined voltage level impressed thereon, the predetermined voltage level being a voltage level between the biasing voltage level and ground.

32. A method as claimed in claim 30, further comprising:
second clamping to clamp the second differential output signal of the second differential amplifier stage to a second predetermined voltage level during the at least one predetermined mode, to prevent electrical overstress (EOS) in gate oxide layers of at least the third differential amplifier stage during the at least one predetermined mode.

33. A method as claimed in claim 28, clamping to clamp the first differential output signal of the first differential amplifier stage to the predetermined voltage level during at least a power reduction mode to prevent electrical overstress (EOS) in gate oxide layers of at least the first differential amplifier stage during the power reduction mode.

34. A method as claimed in claim 28, further comprising:
shorting differential output signal lines of the first differential amplifier stage together during the at least one predetermined mode, to maintain the differential output signal lines at substantially a common voltage.

35. A method as claimed in claim 28, further comprising:
limiting a voltage difference between differential output signal lines of the first differential amplifier stage, to a predetermined maximum voltage difference.

36. A method as claimed in claim 28, the second differential amplifier stage comprising a voltage drop circuit reducing a voltage swing level of the second differential output signal to a lower voltage swing level than the first differential output signal of the first differential amplifier stage.

* * * * *